United States Patent
Iwai (10) Patent No.: US 8,390,180 B2
(45) Date of Patent: Mar. 5, 2013

(54) SURFACE MOUNTED CRYSTAL RESONATOR

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 332 days.

(21) Appl. No.: 12/928,775

(22) Filed: Dec. 17, 2010

(65) Prior Publication Data

US 2011/0156529 A1 Jun. 30, 2011

(30) Foreign Application Priority Data

Dec. 26, 2009 (JP) ................................. 2009-296457
Mar. 31, 2010 (JP) ................................. 2010-080740

(51) Int. Cl.
*H01L 41/047* (2006.01)
(52) U.S. Cl. ........................................ 310/365; 310/370
(58) Field of Classification Search .................. 310/365, 310/370
See application file for complete search history.

(56) References Cited

U.S. PATENT DOCUMENTS

2008/0030106 A1* 2/2008 Stranford et al. ............. 310/365

FOREIGN PATENT DOCUMENTS

| JP | 2001-351920 | 12/2001 |
|----|-------------|---------|
| JP | 2004-64701 | 2/2004 |
| JP | 2004-140103 | 5/2004 |
| JP | 2006-5027 | 1/2006 |
| JP | 2007-294649 | 11/2007 |
| JP | 2008-182665 | 8/2008 |
| WO | WO2006/001125 | 1/2006 |

* cited by examiner

*Primary Examiner* — Thomas Dougherty
(74) *Attorney, Agent, or Firm* — Edwards Wildman Palmer LLP; Scott D. Wofsy (57) ABSTRACT

An object of the invention is to provide a surface mounted resonator that improves impact resistance by the shape of a mounting terminal provided on an outside bottom face of a stacked resonator. A surface mounted crystal resonator is provided with a plurality of mounting terminals electrically connected to a hermetically sealed crystal piece at both ends of an outside bottom face having a rectangular shape long in the lengthwise direction, the mounting terminals having the same external dimensions with a total dimension of the mounting terminals in a lengthwise direction of the outside bottom face being 70% or more [but less than 100%] of a dimension in the lengthwise direction of the outside bottom face. Respective facing sides of the mounting terminals facing each other in a central area of the outside bottom face are formed curved in a convex shape such that a curvature thereof decreases gradually.

8 Claims, 6 Drawing Sheets

SURFACE MOUNTED CRYSTAL RESONATOR

TECHNICAL FIELD

The present invention relates to a surface mounted crystal resonator (hereinafter, referred to as "surface mounted resonator") provided with a mounting terminal on an outside bottom face, and more specifically, relates to a stacked crystal resonator (stacked resonator) with improved impact resistance.

BACKGROUND ART

1. Background of the Invention

The surface mounted resonator, because of its small size and lightweight, is built into, for example, portable electronic devices as a reference source for frequency and time. As one of these surface mounted resonators, there is a stacked resonator with particularly small thickness, and for example, there is a stacked resonator in which both of a vibrating plate and a holding plate are made of crystal, and these are directly bonded (refer to Patent Document 1).

2. Prior Art

Figure 5A:
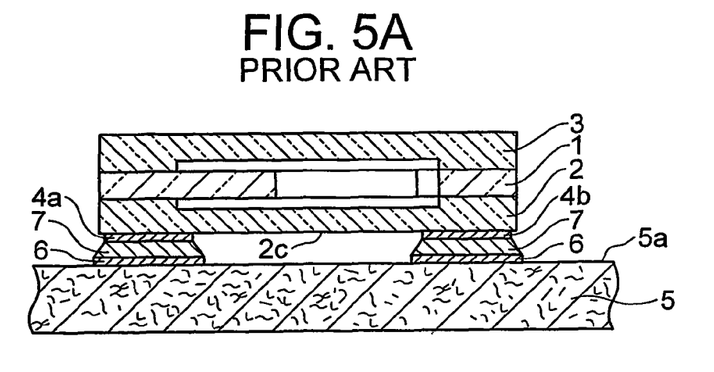
FIG. 5A is a sectional view on arrow A-A in a long side direction of the stacked resonator shown in FIG. 5B.
Figure 5B:
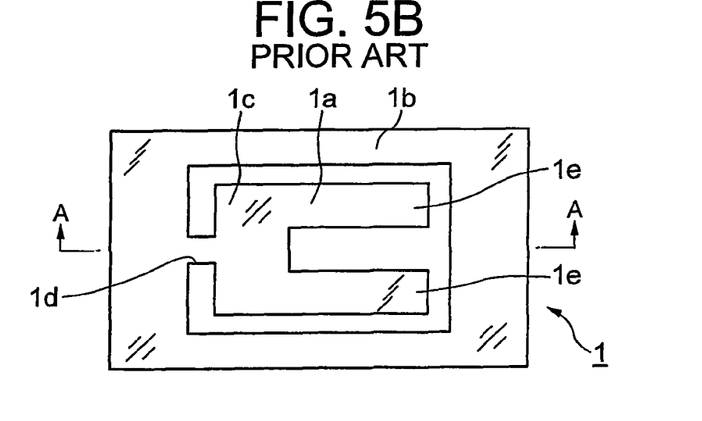
FIG. 5B is a plan view of a vibrating plate.
Figure 5C:
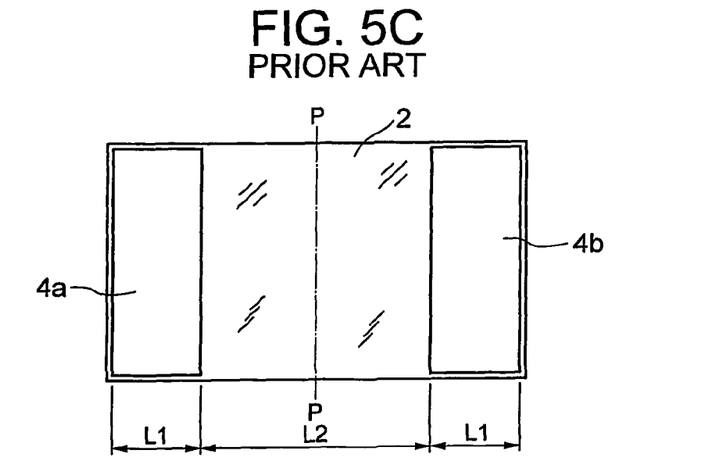
FIG. 5C is a plan view of an outside bottom face thereof.

FIG. 5 is an explanatory diagram of one conventional example of a stacked resonator, wherein FIG. 5A is a sectional view on arrow A-A in the lengthwise direction of the stacked resonator shown in FIG. 5B, FIG. 5B is a plan view of a vibrating plate 1, and FIG. 5C is a plan view of an outside bottom face 2c of the stacked resonator.

The stacked resonator has a rectangular shape in plan view, for example, with the dimension being 2.0×1.2 mm or 2.0×1.6 mm, and includes the vibrating plate 1 and a first holding plate 2, and a second holding plate 3, which have the same external shape. These are made of crystal with the same cutting angle, and stacked by direct bonding by, for example, siloxane bonding (Si—O—Si). However, the vibrating plate 1 and the first holding plate 2, and the second holding plate 3 are directly bonded beforehand in a state of a crystal wafer (not shown), and then divided into individual stacked resonators.

In the vibrating plate 1, a bottom face of a tuning fork base 1c of a crystal piece 1a having a tuning fork shape is coupled with an outer peripheral frame 1b by a connecting bar 1d. Each surface (both principal surfaces and both side faces) of a pair of tuning fork arms 1e has excitation electrodes forming pairs (not shown), and for example, a lead out terminal (not shown) is extended from one principal surface of the tuning fork base 1c to both lengthwise ends of the tuning fork arms 1e of the crystal piece 1a via, the connecting bar 1d.

The first holding plate 2 and the second holding plate 3 are both formed in a concave shape in cross-section, for example, by etching. The first holding plate 2 has mounting terminals 4a and 4b (for example, two terminals) having a rectangular shape in plan view, along a widthwise direction, on both ends of the outside bottom face (one principal surface) 2c, which is flat. Moreover, the first holding plate 2 is electrically connected to the lead out terminals extended to both ends of the vibrating plate 1, by a through electrode or the like (not shown) provided on the first holding plate 2.

As shown in FIG. 5C, the mounting terminals 4a and 4b each have a dimension L1 in the lengthwise direction of the first holding plate 2, which is 0.6 mm, with a dimension (exposed length) L2 in the lengthwise direction of the first holding plate 2 in a central area (exposed surface of a base material) formed between the mounted terminals 4a and 4b being 0.8 mm. Furthermore these stacked resonators are bonded, as shown in FIG. 5A, to a circuit terminal 6 on a set substrate 5 by a lead-free solder 7, and mounted on a surface 5a of the set substrate 5.

PRIOR ART DOCUMENTS

[Patent Document 1] Japanese Unexamined Patent Publication No. 2008-182665
[Patent Document 2] Japanese Unexamined Patent Publication No. 2004-64701
[Patent Document 3] Japanese Unexamined Patent Publication No. 2006-5027
[Patent Document 4] Japanese Unexamined Patent Publication No. 2007-294649
[[Patent Document 5] Japanese Patent Application No. 2007-271426 [Not Relevant]]

SUMMARY OF THE INVENTION

Problem of the Conventional Technique

However in the conventional stacked resonator having the above-described configuration, there is a problem in that after the stacked resonator is mounted on the set substrate 5 shown in FIG. 5A, a crack such as a chip or fracture may be generated in the first holding plate 2, and further, in the connecting bar 1d of the vibrating plate 1, for example, due to dropping impact from above. In this case, the crack occurs in the central area where the base material (crystal) of the first holding plate 2 formed between the mounting terminals 4a and 4b at both ends of the first holding plate 2 is exposed.

That is, both ends of the first holding plate 2 become fixed portions, with strength being increased due to fixation of the mounting terminals 4a and 4b by the solder 7, and vertical movement (flexure) is intensified in the central area where the base material is exposed, particularly, on a center line (P-P). That is, the center line (P-P) functions as an operating point with respect to an external impact, designating both ends (fixed portions) of the first holding plate 2 as fulcrum points.

In this case, as the exposed length L2 of the base material (crystal) in the central area increases with respect to the lengthwise direction of the outside bottom face 2c of the stacked resonator shown in FIG. 5C, the length from the fixed end (a boundary portion between the mounting terminals 4a and 4b and the exposed surface) to the center line (P-P) increases. Hence the moment on the center line from the fixed end (boundary portion) also increases, and a crack is likely to occur in the first holding plate 2.

Figure 6A:
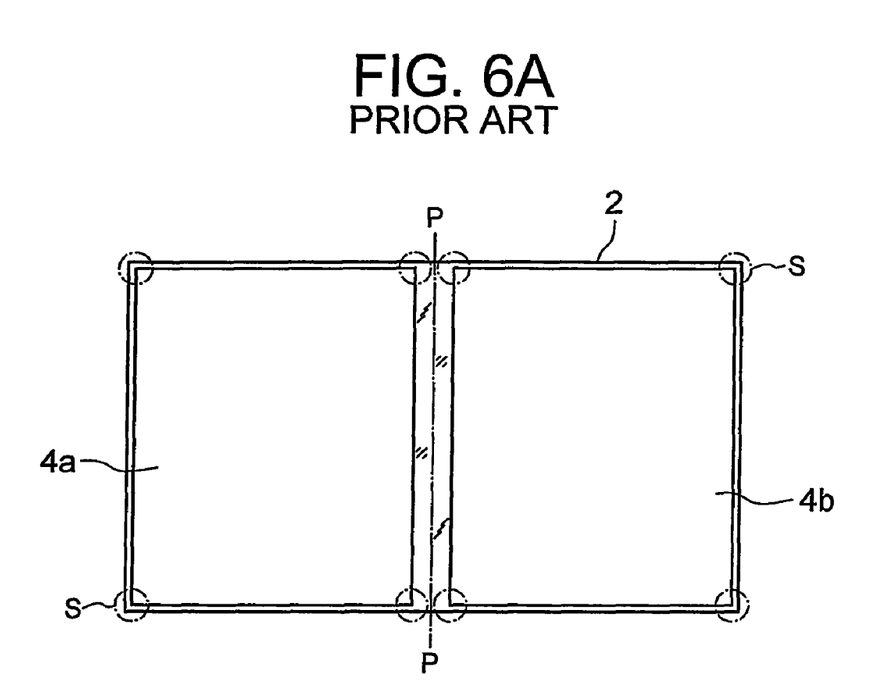
FIG. 6A and FIG. 6B are plan views of the outside bottom face of the stacked resonator.

Therefore, for example, as shown in the aforementioned Patent Document 2, the areas of the mounting terminals 4a and 4b are increased, for example, the mounting terminals 4a and 4b are made substantially the same width as the outside bottom face 2c, with the dimension thereof in the lengthwise direction of the outside bottom face 2c being approximately 70% and the exposed length of the base material being 20% (refer to FIG. 6A). In this case, the mounting terminals 4a and 4b have the same length. As a result, a distance between the mounting terminals 4a and 4b decreases and the vertical movement (flexure) on the center line also decreases, so that the occurrence of a crack in the central area can be suppressed.

However, even in this case, when both ends of the first holding plate 2 provided with the mounting terminals 4a and 4b are fixed and stress distribution with respect to the external impact is analyzed by the finite element method, then as shown in FIG. 6A, the stress concentrates at four corners shown by virtual lines S of the respective mounting terminals 4a and 4b. Moreover in the experimental result, a crack occurs particularly in the central area where the base material is exposed, which is between respective facing sides of the mounting terminals 4a and 4b. That is, even if the exposed length L2 between the mounting terminals 4a and 4b (refer to FIG. 5C) is decreased to shorten the vertical movement on the center line, the stress still concentrates at both corners of the facing sides of the mounting terminals 4a and 4b, causing a crack to occur in the first holding plate 2 even with slight vertical movement.

Figure 6B:
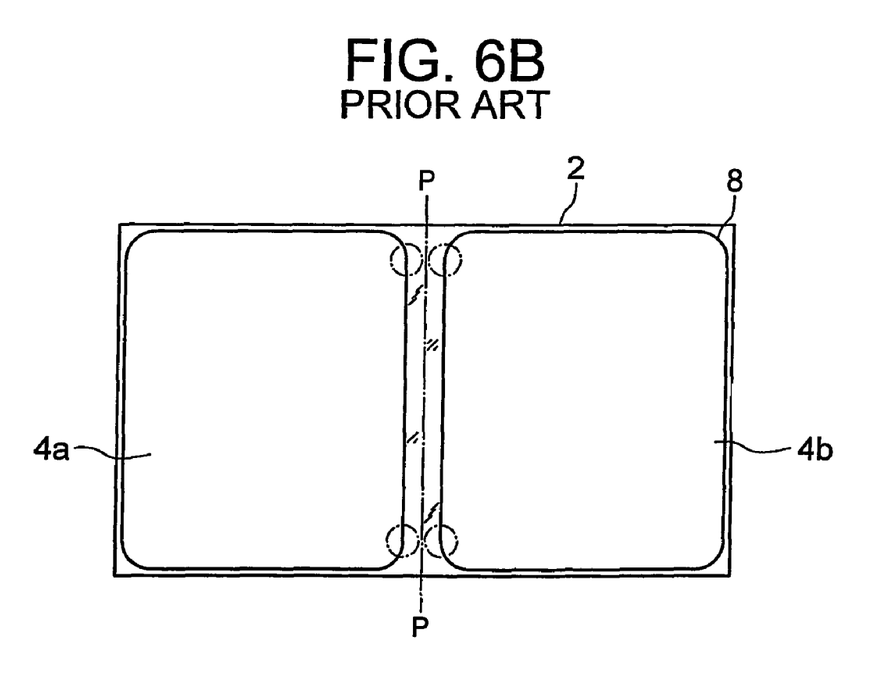

Accordingly, for example, as shown in the above-described Patent Documents 3 and 4, [and 5], it is considered to provide, for example, a circular arc portion 8 at the four corners (refer to FIG. 6B). However, even in this case, although there is some effect due to the circular arc portions 8, the stress concentrates locally at the intersection between the linear portion and the circular arc, and a crack occurs in the central area of the first holding plate 2, due to the stress at the intersection particularly shown by the virtual lines closest to each other.

Object of the Invention

It is an object of the present invention to provide a surface mounted resonator that improves impact resistance by the shape of a mounting terminal provided on an outside bottom face of a first holding plate 2.

The present invention provides a surface mounted crystal resonator having a mounting terminal electrically connected to a hermetically sealed crystal piece at both ends of an outside bottom face having a rectangular shape long in one direction, the respective mounting terminals having the same external dimensions, with a total dimension thereof in a lengthwise direction of the outside bottom face being 70% or more, but less than 100% of a dimension in the lengthwise direction of the outside bottom face. Respective sides of the mounting terminals facing each other in a central area of the outside bottom face are curved in a convex shape such that a curvature thereof decreases gradually.

According to such a configuration, because the dimensions of the respective mounting terminals in the lengthwise direction are made the same to increase the total dimension thereof, vertical movement (flexure) on a center line, which bisects the lengthwise direction of the outside bottom face, decreases. Moreover, because the respective sides of the mounting terminals facing each other (facing sides) are curved in the convex shape, stress concentration at both corners of the facing sides is alleviated, particularly at the time of impact. Furthermore, because the facing sides of the mounting terminals are curved so that the curvature thereof gradually decreases, stress due to an impact is distributed from both corners toward the center and gradually decreases, thereby enabling to avoid local stress concentration in any of the facing sides. Consequently, the occurrence of a crack due to stress concentration at the outside bottom face between the mounting terminals can be suppressed.

Moreover, in the present invention, both corners of respective sides of the mounting terminals, which become both end edges of the outside bottom face have a circular arc portion. As a result, the stress at the time of, for example, thermal impact generated at the four corners of an outer periphery of the outside bottom face can be alleviated, and a crack in the solder, for example, mounted on a set substrate can be prevented (refer to the above-described Patent Documents 3 and 4).

Furthermore in the present invention, the mounting terminals have an elliptical shape with the widthwise direction of the outside bottom face being the major axis. As a result, in the mounting terminals, corners intersecting with a straight line can be excluded from the entire outer periphery, and hence the stress concentration at the time of external impact and thermal impact is eliminated. Therefore, the occurrence of a crack in the outside bottom face of the first holding plate, and a crack in the solder at the time of thermal impact can be prevented.

Moreover in the present invention, a bottom wall layer, which becomes the outside bottom face, is made of crystal or glass. As a result, because crystal or glass has a lower strength than that of the general ceramic serving as a container of the surface mounted resonator, the effect of the present invention (elimination of stress concentration at the time of impact) becomes particularly noticeable. However, even in the case of ceramic, the same effect can be realized in the case where the thickness of the bottom wall layer of the outside bottom face, which is crystal or glass, is made extremely thin.

Furthermore in the present invention, the crystal piece is formed from a vibrating plate bonded to an outer peripheral frame by a connecting bar, concave faces of the first and the second holding plates both made of crystal and having a concave shape in cross-section face each other and are stacked by direct bonding on both principal surfaces of the vibrating plate, and the mounting terminals are provided on the outside bottom face of the first holding plate.

BRIEF DESCRIPTION OF THE DRAWINGS

FIG. 1 is an explanatory diagram of one embodiment of a stacked resonator of the present invention, wherein

FIG. 2 is a plan view of the outside bottom face for explaining another embodiment of the stacked resonator of the present invention, wherein

FIG. 5 is an explanatory diagram of a conventional example of the stacked resonator, wherein

FIG. 6 is an explanatory diagram of another conventional example of the stacked resonator, wherein

BEST MODE FOR CARRYING OUT THE INVENTION

An embodiment of the present invention is explained hereunder with reference to FIG. 1, using a stacked resonator as an example.

Figure 1A:
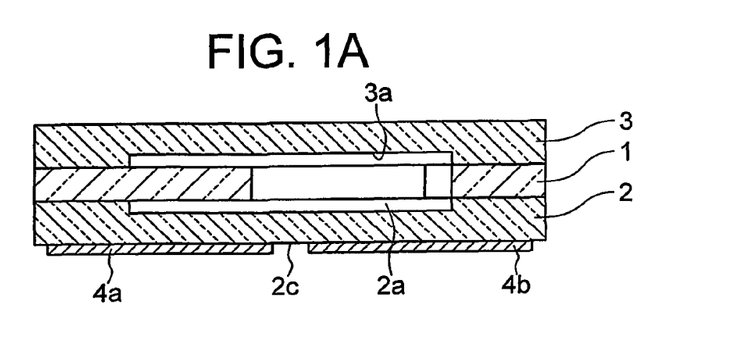
FIG. 1A is a sectional view on arrow A-A in a long side direction of the stacked resonator shown in FIG. 1B.
Figure 1B:
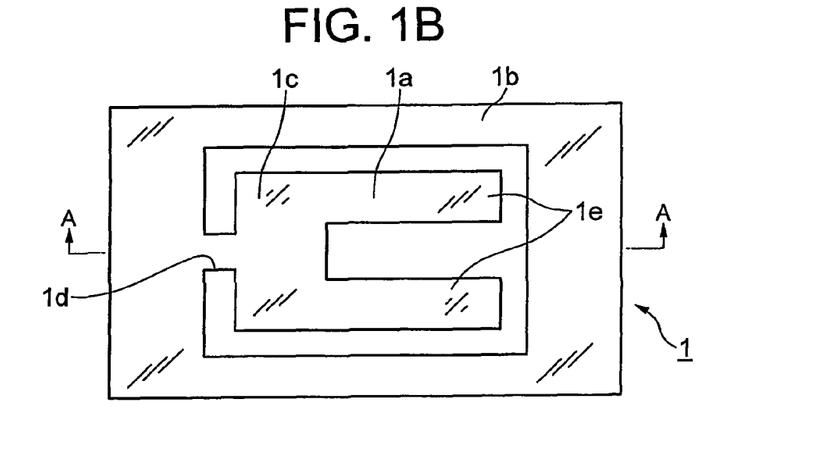
FIG. 1B is a plan view of a vibrating reed.

In the stacked resonator, as shown in FIG. 1A and FIG. 1B, for example, an external dimension of a plane surface thereof is 2.0×1.2 mm. The stacked resonator is constituted by stacking a first holding plate 2 (bottom wall layer) and a second holding plate 3 both having a concave shape in cross-section, on both principal surfaces of a vibrating plate 1 in which a turning-fork crystal piece 1a is coupled to an outer peripheral frame 1b. In the first and second holding plates 2 and 3, concave surface 2a and 3a sides face both principal surfaces of the vibrating plate 1, and a concave thick part 3a [thick part thereof] is directly bonded to the outer peripheral frame 1b by siloxane bonding. Furthermore mounting terminals 4a and 4b (for example, two terminals) electrically connected to the turning-fork crystal piece 1a are provided on both ends of an outside bottom face 2c, which is on the flat surface side of the first holding plate 2.

Figure 1C:
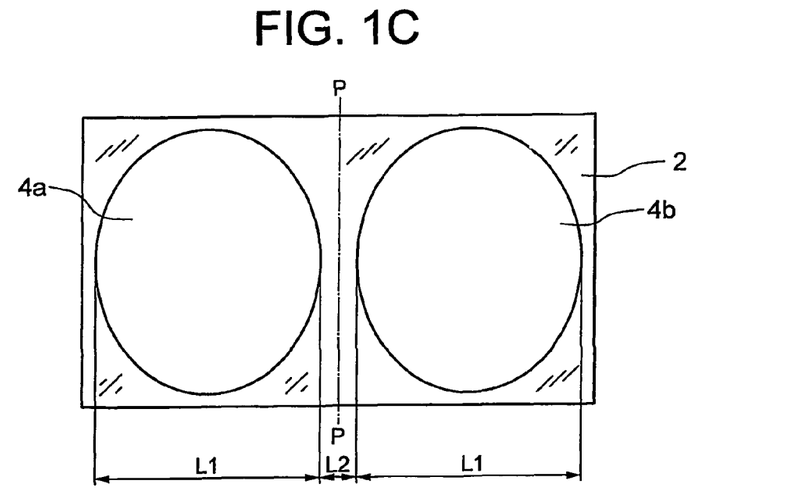
FIG. 1C is a plan view of an outside bottom face.

As shown in FIG. 1C, the mounting terminals 4a and 4b have the same shape and dimension, and here, these have an elliptical shape, with a widthwise direction of the outside bottom face 2c of the first holding plate 2 being the major axis and the lengthwise direction being the minor axis. For example, the major axis of the mounting terminals 4a and 4b is 1.1 mm and the minor axis is 0.7 mm. As a result, the total length of the minor axes of the mounting terminals 4a and 4b is approximately 70% (70% or more, but less than 100%) of the length of the outside bottom face, and the total area thereof is approximately 50% of the area of the outside bottom face. Moreover, as shown in FIG. 5A, as in the conventional example, the mounting terminals 4a and 4b are bonded to a set substrate 5 by a solder 7.

In such an embodiment, as shown in FIG. 1C, the total dimension (L1+L1) in the minor axis direction, which is the lengthwise direction of the outside bottom face, of the elliptical mounting terminals 4a and 4b is increased to decrease an exposed length L2 of the base material (crystal). Accordingly, as shown in FIG. 5A, when both ends where the mounting terminals 4a and 4b are formed are fixed to the set substrate 5, vertical movement (flexure) of the base material between the mounting terminals 4a and 4b, with both ends being fixed, decreases considerably. Particularly, vertical movement on the center line (P-P) which bisects the lengthwise direction of the outside bottom face 2c decreases.

Furthermore, as shown in FIG. 1C, because the mounting terminals 4a and 4b are in an elliptical shape in plan view, right angle portions at the four corners thereof are rounded off, and because there is no intersection with a straight line as in the conventional example in which the mounting terminals are in a circular arc shape, there is no local stress concentration due to an impact at any of the four corners and the stress is distributed. In this case, the stress concentrates and becomes largest at both ends of the mounting terminals 4a and 4b in the major axis direction of the elliptical shape having the largest curvature, and the stress at both ends thereof in the minor axis direction having the smallest curvature becomes the smallest. However, because both ends in the major axis direction of the elliptical shape have an obtuse angle rather than the four corners in the case of a rectangular shape, the stress becomes smaller. In short, the curvature becomes largest at both ends in the major axis direction of the elliptical shape, and continuously decreases toward both ends in the minor axis direction. Accompanying this, the stress distribution becomes such that the stress becomes largest at both ends in the major axis direction, and gradually decreases toward both ends in the minor axis direction facing each other.

Consequently, vertical movement on the center line (P-P) bisecting the lengthwise direction of the outside bottom face 2c of the stacked resonator decreases, and the stress at both ends in the major axis direction of the mounting terminals 4a and 4b decreases. Therefore, an occurrence of a crack in the central area including on the center line where the base material is exposed can be prevented. In this case, a gap between both ends of the minor axis facing each other of the elliptical shape gradually decreases from both ends of the major axis thereof to increase an influence of the stress with respect to the vertical movement. However, the stress decreases from both ends of the major axis toward both ends of the minor axis facing each other, and hence, the influence of the stress with respect to the vertical movement is offset.

Furthermore, in this example, the mounting terminals 4a and 4b have the elliptical shape and the right angle portions at the four corners of the outside bottom face 2c of the first holding plate 2 are removed. Consequently, as shown in FIG. 5A, after mounting the mounting terminals 4a and 4b on the set substrate 5 using the solder 7, for example, stress concentration at the four corners due to a difference in the coefficient of thermal expansion between the mounting terminals 4a and 4b and the set substrate 5 can be avoided, and an occurrence of a crack in the solder 7 can be prevented. Even in this case, the stress is distributed more than in the case of simply cutting diagonally the corners of the rectangular shape of the mounting terminals 4a and 4b, as mentioned before, and hence impact resistance can be increased.

Moreover, crystal and glass can be used for the first and second holding plates 2 and 3. For example, if borosilicate glass is used, manufacturing cost of the stacked resonator can be reduced, because borosilicate glass is inexpensive compared to crystal.

Furthermore, when crystal is used for the first and second holding plates 2 and 3, suppression of an occurrence of a crack can be further maintained, while downsizing and thinning the stacked resonator, as compared to a case in which borosilicate glass is used. This is because the Knoop hardness of borosilicate glass is 590 kg/mm$^2$, while the Knoop hardness of crystal is 710 to 790 kg/mm$^2$, which is higher than that of borosilicate glass.

Figure 2A:
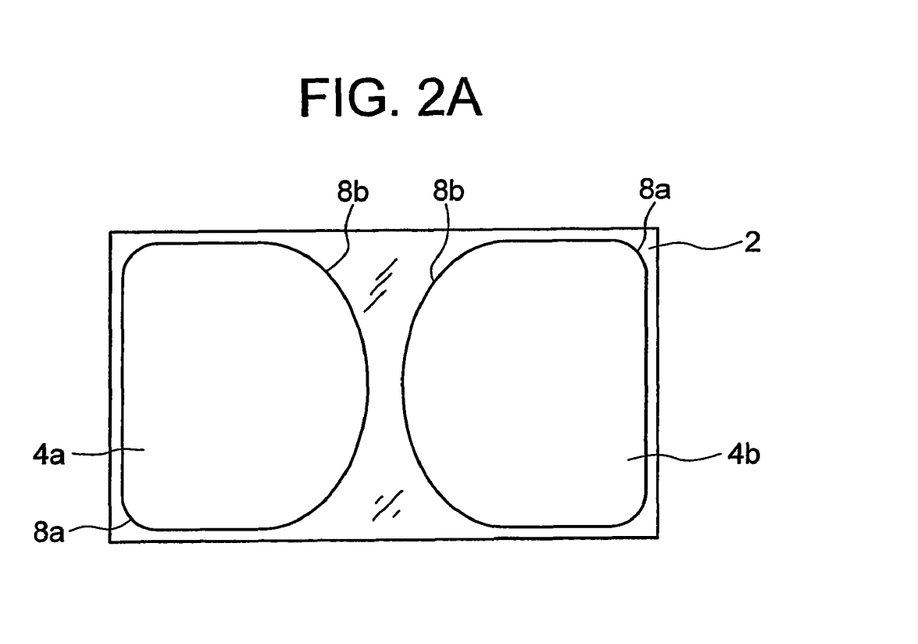
FIG. 2A is a plan view of the outside bottom face in which facing sides of mounting terminals are curved in a convex shape and both corners on an outer peripheral side thereof are in a circular arc shape.
Figure 2B:
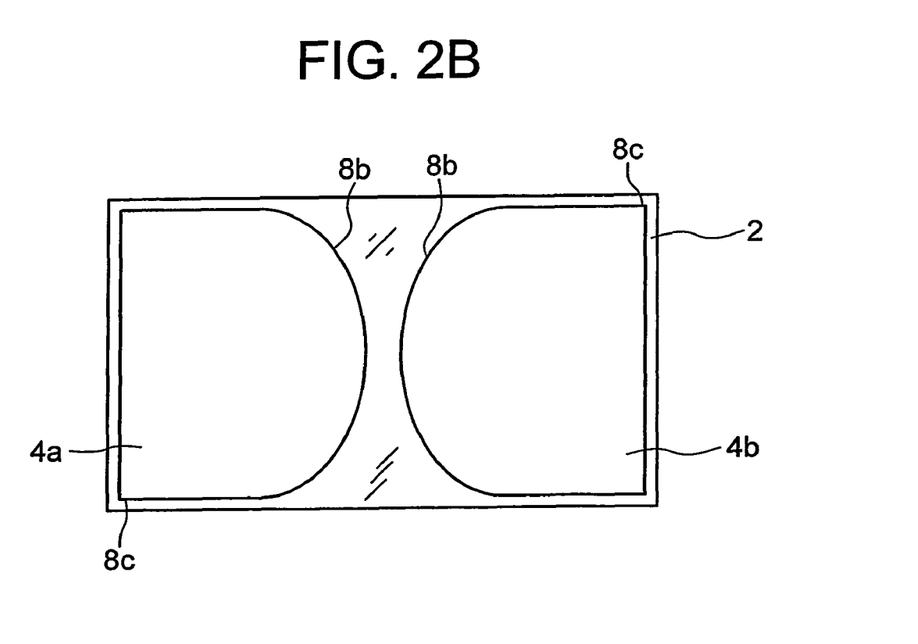
FIG. 2B is a plan view of the outside bottom face in which both corners on the outer peripheral side are right angle portions.
Figure 3:
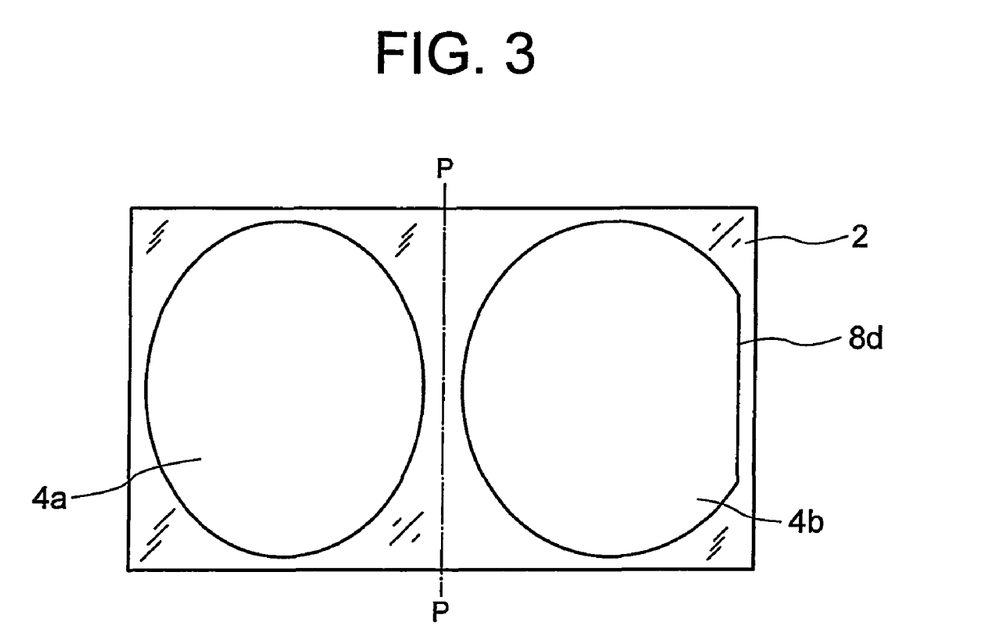
FIG. 3 is a plan view of the outside bottom face for explaining still another embodiment of the stacked resonator of the present invention.

Moreover, in the above-described embodiment of the present invention, the mounting terminals 4a and 4b provided on the outside bottom face 2c of the first holding plate 2 are in an elliptical shape. However, for example, as shown in FIG. 2A, the facing sides of the mounting terminals 4a and 4b respectively have a convex curved shape 8b and both corners of the outer peripheral side (on the side opposite to the facing side) may be diagonally cut to become circular arc portions 8a. Even in this case, a crack in the central area of the first holding plate 2 and a crack in the solder 7 can be prevented as in the above-described embodiment. Furthermore, in a case where the crack in the solder 7 can be ignored, then as shown in FIG. 2B, both ends of the outer peripheral side can be right angle portions 8c. Moreover, when directionality of the stacked resonator is required, then as shown in FIG. 3, for example, a dimension of any one of the mounting terminals 4a and 4b in the minor axis direction can be increased, and the outer peripheral side thereof can be linearly cut to have a linear portion 8d, so that the mounting terminals 4a and 4b are formed asymmetrically with respect to the center line P-P.

Figure 4:
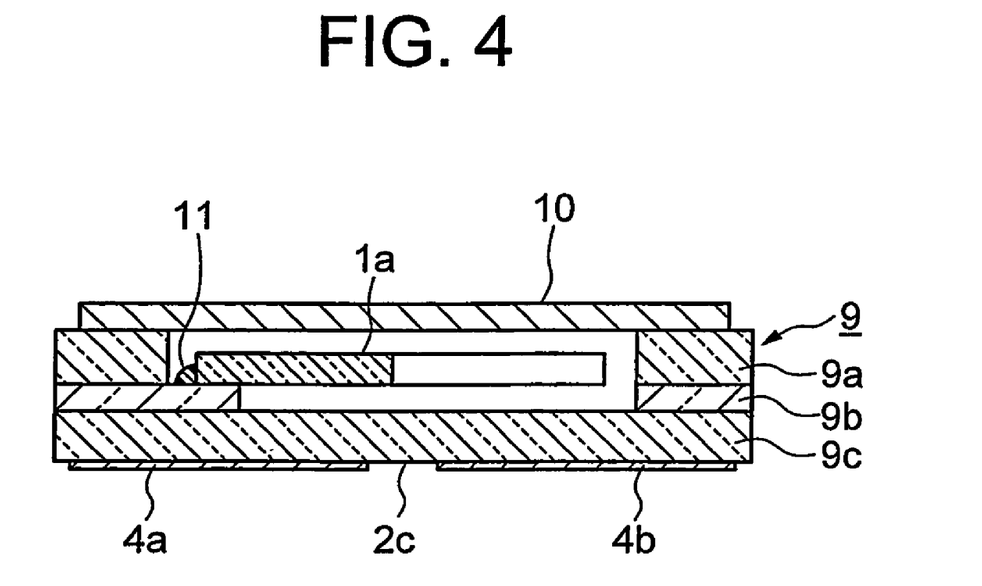
FIG. 4 is a sectional view for explaining another application example of a surface mounted resonator of the present invention.

The present invention has been explained as a stacked resonator. However, for example, as shown in FIG. 4, the present invention can be similarly applied to a case in which a crystal piece 1a having a tuning fork shape is bonded by an electrically-conductive adhesive to a crystal plate 9b, and housed in a container body 9 (formed by stacking crystal plates 9a, 9b, and 9c) in a concave shape in cross-section having mounting terminals 4a and 4b on an outside bottom face 2c thereof, and hermetically sealed by a cover 10. In this case, the container body 9 can be made of crystal, glass, or ceramic. However, because crystal and glass are more brittle than ceramic and have a lower strength, the effect of the present invention becomes more noticeable for crystal and glass. Furthermore, in the embodiment of the present invention, the crystal piece 1*a* has a tuning fork shape. However, the present invention is similarly applicable to a case in which the crystal piece 1*a* is an AT-cut flat plate.

What is claimed is:

1. A surface mounted crystal resonator provided with a plurality of mounting terminals electrically connected to a hermetically sealed crystal piece at both ends of an outside bottom face having a rectangular shape long in the widthwise direction, said mounting terminals having the same external dimensions with a total dimension of the external dimension of said mounting terminals in a lengthwise direction of said outside bottom face being approximately 70% or more [but less than 100%] of a dimension in the lengthwise direction of said outside bottom face, and respective facing sides of said mounting terminals facing each other in a central area of said outside bottom face are curved in a convex shape such that a curvature thereof decreases gradually.

2. A surface mounted crystal resonator according to claim 1, wherein both corners of respective sides of said mounting terminals which become both end edge sides of said outside bottom face are formed in a circular arc shape.

3. A surface mounted crystal resonator according to claim 1, wherein said mounting terminals have an elliptical shape with the widthwise direction of said outside bottom face being the major axis.

4. A surface mounted crystal resonator according to claim 1, wherein facing sides of said mounting terminals respectively have a convex curved shape, and both ends of outer peripheral sides of said mounting terminals are a circular arc shape.

5. A surface mounted crystal resonator according to claim 1, wherein facing sides of said mounting terminals respectively have a convex curved shape, and both ends of outer peripheral sides of said mounting terminals are a right angled shape.

6. A surface mounted crystal resonator according to claim 1, wherein an outer peripheral side of said mounting terminals of any one of said mounting terminals is formed in a linear shape.

7. A surface mounted crystal resonator according to claim 1, wherein a bottom wall layer having said outside bottom face, is made of crystal or glass.

8. A surface mounted crystal resonator according to claim 1, wherein said crystal piece is formed from a vibrating plate bonded to an outer peripheral frame by a connecting bar, concave faces of first and the second holding plates both made of crystal and having a concave shape in cross-section face each other and are stacked by direct bonding on both principal surfaces of said vibrating plate, and said mounting terminals are provided on the outside bottom face of said first holding plate.

* * * * *